(12) United States Patent
Wang et al.

(10) Patent No.: US 11,839,025 B2
(45) Date of Patent: Dec. 5, 2023

(54) FLEXIBLE PRINTED CIRCUIT AND MANUFACTURING METHOD THEREOF, AND DISPLAYING DEVICE

(71) Applicants: Beijing BOE Optoelectronics Technology Co., Ltd., Beijing (CN); BOE Technology Group Co., Ltd., Beijing (CN)

(72) Inventors: Xiaoxia Wang, Beijing (CN); Shouyang Leng, Beijing (CN); Qing Ma, Beijing (CN); Rui Han, Beijing (CN); Jie Yu, Beijing (CN); Dong Cui, Beijing (CN); Pengtao Li, Beijing (CN); Tielei Zhao, Beijing (CN); Chunhua Wang, Beijing (CN); Xiaoqiao Dong, Beijing (CN); Yaoyao Wang, Beijing (CN); Jing Yu, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 168 days.

(21) Appl. No.: 17/485,214

(22) Filed: Sep. 24, 2021

(65) Prior Publication Data
US 2022/0240381 A1 Jul. 28, 2022

(30) Foreign Application Priority Data
Jan. 25, 2021 (CN) .......................... 202110098822.8

(51) Int. Cl.
*H05K 1/03* (2006.01)
*H05K 3/24* (2006.01)
(Continued)

(52) U.S. Cl.
CPC ..... *H05K 1/0393* (2013.01); *G02F 1/133308* (2013.01); *G02F 1/133608* (2013.01); *H05K 3/24* (2013.01); *H05K 3/4652* (2013.01)

(58) Field of Classification Search
None
See application file for complete search history.

(56) References Cited

U.S. PATENT DOCUMENTS

2014/0118969 A1* 5/2014 Lee ..................... H01L 23/4985
361/749
2022/0019105 A1* 1/2022 Liu .................... G02F 1/133305

FOREIGN PATENT DOCUMENTS

| CN | 206136441 U | * | 4/2017 | |
| WO | WO-2015033736 A1 | * | 3/2015 | ............. H05K 1/028 |
| WO | WO-2020170653 A1 | * | 8/2020 | ........ G02F 1/133314 |

* cited by examiner

*Primary Examiner* — Phu Vu
(74) *Attorney, Agent, or Firm* — IPro, PLLC

(57) ABSTRACT

A flexible printed circuit and manufacturing method thereof, and a displaying device. A wiring layer is arranged on a flexible substrate, a reinforcing layer is arranged on a side of the flexible substrate away from the wiring layer, the wiring layer comprises a plurality of signal wirings arranged along a first wiring area, a second wiring area, a third wiring area and a fourth wiring area, and the reinforcing layer comprises a first reinforcing structure located in the second wiring area and a second reinforcing structure located in the fourth wiring area. The impact strength of the flexible printed circuit is increased by arranging the first reinforcing structure in the second wiring area of the flexible substrate and arranging the second reinforcing structure in the fourth wiring area of the flexible substrate.

14 Claims, 3 Drawing Sheets

(51) Int. Cl.
*G02F 1/13357* (2006.01)
*G02F 1/1333* (2006.01)
*H05K 3/46* (2006.01)

601 — Provide a flexible substrate, wherein the flexible substrate is divided into wiring areas and a first bonding area and a second bonding area which are located on two sides of the wiring areas, and the wiring areas include a first wiring area, a second wiring area, a third wiring area and a fourth wiring area which are away from the first bonding area in sequence 602 — Form a wiring layer on the flexible substrate, wherein the wiring layer comprises a plurality of signal wirings arranged along the first wiring area, the second wiring area, the third wiring area and the fourth wiring area 603 — Form a reinforcing layer on a side of the flexible substrate away from the wiring layer, wherein the reinforcing layer comprises a first reinforcing structure located in the second wiring area and a second reinforcing structure located in the fourth wiring area

Fig. 6

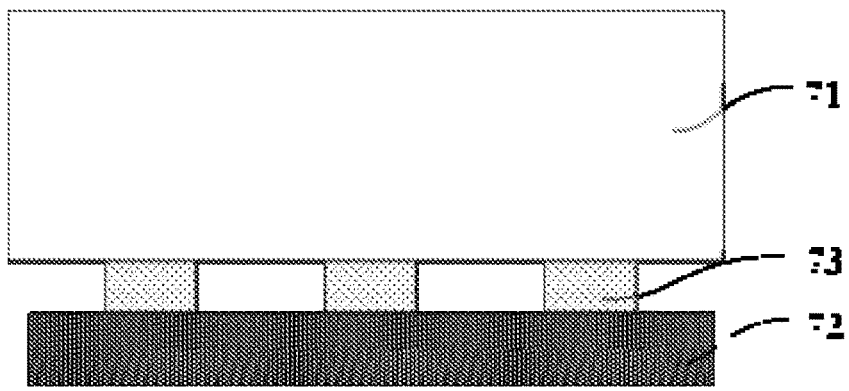

Fig. 7

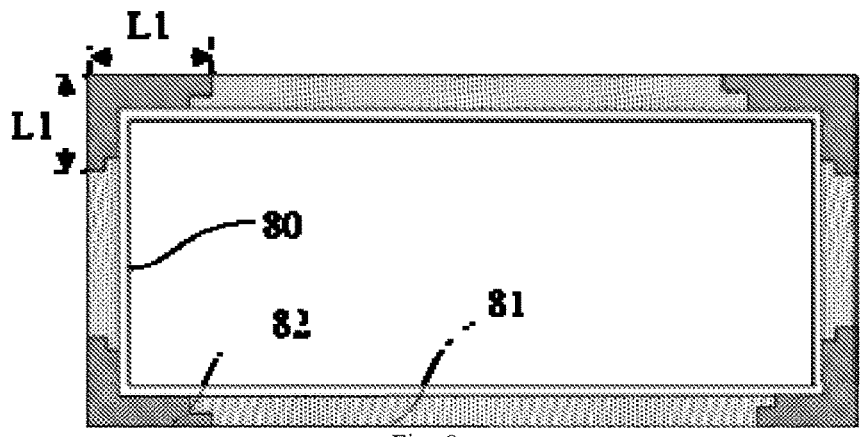

Fig. 8

FLEXIBLE PRINTED CIRCUIT AND MANUFACTURING METHOD THEREOF, AND DISPLAYING DEVICE

CROSS REFERENCE TO RELEVANT DISCLOSURES

The present application claims the priority of the Chinese patent application filed on Jan. 25, 2021 before the Chinese Patent Office with the application number of 202110098822.8 and the title of "FLEXIBLE PRINTED CIRCUIT AND MANUFACTURING METHOD THEREOF, AND DISPLAYING DEVICE", which is incorporated herein in its entirety by reference.

TECHNICAL FIELD

The present disclosure relates to the technical field of display, in particular to a flexible printed circuit and manufacturing method thereof, and a displaying device.

BACKGROUND

In a displaying device, a Flexible Printed Circuit (FPC) is usually adopted to implement circuit connection between a display panel and a Printed Circuit Board (PCB).

SUMMARY

The present disclosure discloses a flexible printed circuit, comprising a flexible substrate, wherein the flexible substrate is divided into wiring areas, and a first bonding area and a second bonding area which are located on two sides of the wiring areas, and the wiring areas include a first wiring area, a second wiring area, a third wiring area and a fourth wiring which are away from the first bonding area in turn;

The flexible printed circuit further comprises a wiring layer arranged on the flexible substrate and a reinforcing layer arranged on a side of the flexible substrate away from the wiring layer;

wherein, the wiring layer comprises a plurality of signal wirings arranged along the first wiring area, the second wiring area, the third wiring area and the fourth wiring area, and the reinforcing layer comprises a first reinforcing structure located in the second wiring area and a second reinforcing structure located in the fourth wiring area.

Optionally, the flexible circuit board further comprising a third reinforcing structure and a fourth reinforcing structure which are arranged on a same layer as the signal wirings, the third reinforcing structure is located in the second wiring area, the fourth reinforcing structure is located in the fourth wiring area, orthographic projections of the third reinforcing structure and the fourth reinforcing structure on the flexible substrate are not superimposed with orthographic projections of the signal wirings on the flexible substrate;

wherein the third reinforcing structure is connected to the first reinforcing structure through a first via hole that penetrates through the flexible substrate, and the fourth reinforcing structure is connected to the second reinforcing structure through a second via hole that penetrates through the flexible substrate.

Optionally, the flexible circuit board further comprising a fifth reinforcing structure arranged on a same layer as the signal wirings, wherein the fifth reinforcing structure is located in the third wiring area, and an orthographic projection of the fifth reinforcing structure on the flexible substrate is not superimposed with orthographic projections of the signal wirings on the flexible substrate;

wherein the fifth reinforcing structure is respectively connected to the third reinforcing structure and the fourth reinforcing structure.

Optionally, the wiring layer further comprises a ground wiring located in the first wiring area, and the ground wiring is connected to the third reinforcing structure;

wherein materials of the first, second, third, fourth and fifth reinforcing structures all are electrically conductive materials.

Optionally, the first reinforcing structure and the second reinforcing structure are both of a net-like structure.

Optionally, the flexible circuit board further comprising a plurality of first gold fingers and a plurality of second gold fingers which are arranged on a same layer as the signal wirings, wherein the first gold fingers are located in the first bonding area, the second gold fingers are located in the second bonding area, and the signal wirings are respectively connected to the first gold fingers and the second gold fingers;

wherein a distance between the second reinforcing structure and each of the second gold fingers is greater than or equal to 0.2 mm.

Optionally, wherein the first bonding area is an area where the flexible circuit board and a display panel are bound, and the second bonding area is an area where the flexible circuit board and a printed circuit board are bound.

The present disclosure further discloses a manufacturing method of a flexible printed circuit, comprising:
  providing a flexible substrate, wherein the flexible substrate is divided into wiring areas, and a first bonding area and a second bonding area which are located on two sides of the wiring areas, and the wiring areas include a first wiring area, a second wiring area, a third wiring area and a fourth wiring which are away from the first bonding area in sequence;
  forming a wiring layer on the flexible substrate, wherein the wiring layer comprises a plurality of signal wirings arranged along the first wiring area, the second wiring area, the third wiring area and the fourth wiring area; and
  forming a reinforcing layer on a side of the flexible substrate away from the wiring layer, wherein the reinforcing layer comprises a first reinforcing structure located in the second wiring area and a second reinforcing structure located in the fourth wiring area.

Optionally, a tape layer is arranged on the exposed part of the flexible circuit board.

The present disclosure further discloses a displaying device, comprising a display panel, a printed circuit board and the aforementioned flexible printed circuit, wherein the flexible printed circuit is respectively bound with the display panel and the printed circuit board.

Optionally, the displaying device further comprises a cover plate and a backlight module, wherein the cover plate covers a light-outgoing surface of the display panel, and the backlight module is located on a side of the display panel away from the cover plate;

wherein, the backlight module comprises an adhesive frame, the adhesive frame is provided with a bonding structure and a buffer structure which are arranged on a same layer on an adhesive frame surface opposite to the cover plate, the bonding structure is respectively bonded with the adhesive frame and the cover plate, and the buffer structure is positioned at a corner position of the adhesive frame surface.

Optionally, the buffer structure has a concave portion on a surface toward the bonding structure, the bonding structure has a convex portion on a surface toward the buffer structure, and the convex portion is embedded in the concave portion.

Optionally, the buffer structure has a length of 15 mm to 30 mm in a direction of the buffer structure toward the bonding structure which contacts the buffer structure.

BRIEF DESCRIPTION OF THE DRAWINGS

To describe the technical solutions in the embodiments of the disclosure more clearly, the drawings required for describing the embodiments of the disclosure may be simply introduced below. Obviously, the drawings depicted below only illustrate some embodiments of the disclosure. Other drawings may further be obtained by a person of ordinary skill in the art according to these drawings without creative work.

FIG. 6 illustrates a flowchart of a manufacturing method of a flexible printed circuit according to the embodiments of the present invention;

FIG. 7 illustrates a structural diagram of the flexible printed circuit respectively bound with a display panel and a printed circuit board according to the embodiments of the present invention; and FIG. 8 illustrates a structural diagram of a bonding structure and a buffer structure on an adhesive frame surface according to the embodiments of the present invention.

DETAILED DESCRIPTION

To make the above purposes, features and advantages of the present disclosure clearer and easily understood, the present disclosure may be described in further detail below in conjunction with the accompanying drawings and specific embodiments.

Figure 1:
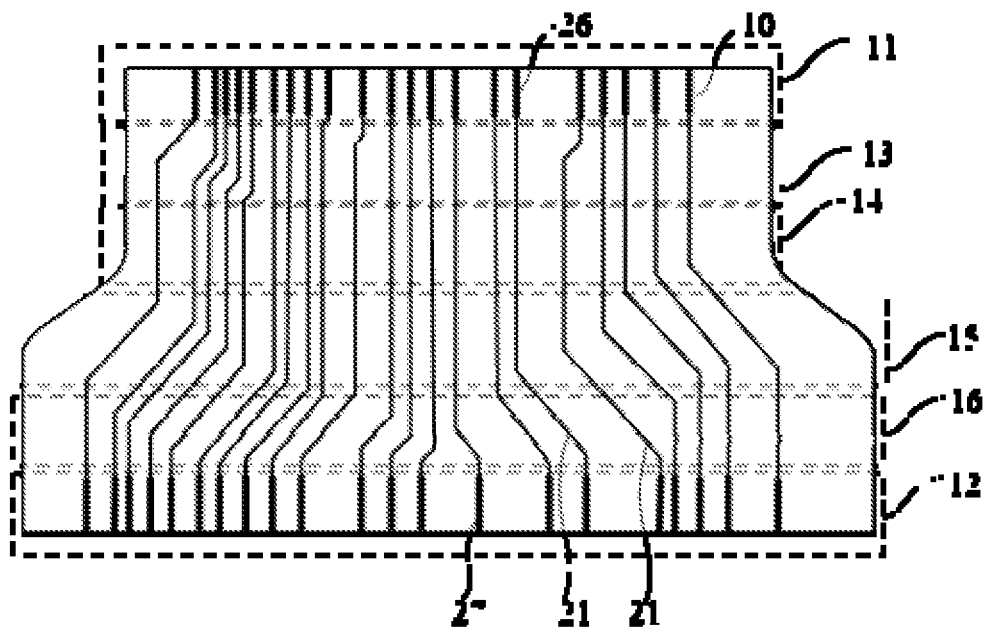
FIG. 1 illustrates a structural diagram of a first surface of a flexible printed circuit according to the embodiments of the present invention.
Figure 2:
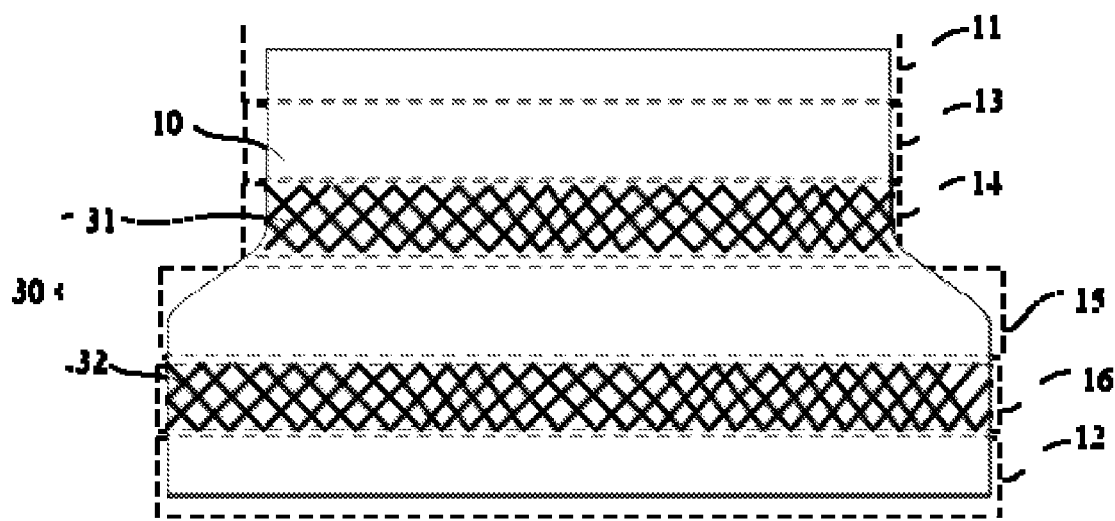
FIG. 2 illustrates a structural diagram of a second surface of the flexible printed circuit according to the embodiments of the present invention.

Refer to FIG. 1 which illustrates a structural diagram of a first surface of a flexible printed circuit according to the embodiments of the present invention, and refer to FIG. 2 which illustrates a structural diagram of a second surface of the flexible printed circuit according to the embodiments of the present invention.

The embodiments of the present disclosure provide a flexible printed circuit. The flexible printed circuit comprises a flexible substrate 10, wherein the flexible substrate 10 is divided into wiring areas, and a first bonding area 11 and a second bonding area 12 which are located on two sides of the wiring areas, the wiring areas include a first wiring area 13, a second wiring area 14, a third wiring area 15 and a fourth wiring area 16 which are away from the first bonding area 11 in sequence; the flexible printed circuit further comprises a wiring layer arranged on the flexible substrate 10 and a reinforcing layer 30 arranged on a side of the flexible substrate 10 away from the wiring layer, wherein the wiring layer comprises a plurality of signal wirings 21 arranged along the first wiring area 13, the second wiring area 14, the third wiring area 15 and the fourth wiring area 16, and the reinforcing layer 30 comprises a first reinforcing structure 31 located in the second wiring 14 area and a second reinforcing structure 32 located in the fourth wiring area 16.

In an actual product, the material of the flexible substrate 10 may be Polyimide (PI) or Polyethylene terephthalate (PET), etc. According to the fixing manner and the fixing position of the flexible printed circuit in the displaying device, the flexible printed circuit is divided into the wiring areas, and the first bonding area 11 and the second bonding area 12 located on two sides of the wiring area, that is, the wiring areas are located between the first bonding area 11 and the second bonding area 12.

Wherein, the wiring areas include the first wiring area 13, the second wiring area 14, the third wiring area 15 and the fourth wiring area 16 which are away from the first bonding area 11 in turn, that is, the first wiring area 13 is located on a side of the first bonding area 11 toward the second bonding area 12, the second wiring area 14 is located on a side of the first wiring area 13 toward the second bonding area 12, the third wiring area 15 is located on a side of the second wiring area 14 toward the second bonding area 12, and the fourth wiring area 16 is located on a side of the third wiring area 15 toward the second bonding area 12.

To implement circuit connection between a display panel and a printed circuit board, a plurality of signal wirings 21 need to be formed on the flexible substrate 10, and the signal wirings 21 are distributed along the first wiring area 13, the second wiring area 14, the third wiring area 15 and the fourth wiring area 16. Specifically, the signal wirings 21 are respectively connected to the display panel and the printed circuit board, and signals, for example a drive signal which drives the display panel to display, provided by the printed circuit board are transmitted to the display panel via the signal wirings 21 so as to drive the display panel to display.

Specifically, the first binding area 11 is an area where the flexible printed circuit and the display panel are bound, and the second binding area 12 is an area where the flexible printed circuit and the printed circuit board are bound.

In a displaying device, for example, an onboard displaying device, after the display panel and the printed circuit board are bound through the flexible printed circuit, it needs to fit a cover plate with the display panel to obtain a display module first; then the display module is fixed together with a backlight module; and finally, the printed circuit board is fixed on a side of the backlight module away from the display panel through the flexible printed circuit. Under such a circumstance, the flexible printed circuit is bent, the first wiring area 13 and the third wiring area 15 are bent areas, and the second wiring area 14 and the fourth wiring area 16 are areas where the flexible printed circuit may receive an impact.

To ensure that the flexible printed circuit is not torn when receiving an impact, it needs to reinforce the strength of the second wiring area 14 and the fourth wiring area 16 in the flexible printed circuit, so the reinforcing layer 30 is formed on the side of the flexible substrate 10 away from the wiring layer. The reinforcing layer 30 comprises the first reinforcing structure 31 located in the second wiring area 14 and the second reinforcing structure 32 located in the fourth wiring area 16, that is, on a surface of the flexible substrate 10 on a side away from the signal wirings 21, the second wiring area 14 therein forms the first reinforcing structure 31, and the fourth wiring area 16 therein forces the second reinforcing structure 32. The strength of the second wiring area 14 is increased by the first reinforcing structure 31, and the strength of the fourth wiring area 16 is increased by the second reinforcing structure 32, thereby improving the impact strength of the flexible printed circuit. Therefore, during use or testing of the displaying device, the flexible printed circuit may not be torn if the displaying device receives an impact, thereby ensuring normal use of the displaying device.

Moreover, in the related art, after the signal wirings are formed on the surface of the flexible substrate, a copper layer is formed on an entire surface of the flexible substrate on a side away from the signal wirings so as to improve the impact strength of the flexible printed circuit. However, after the display panel is bound with the printed circuit board through the flexible printed circuit, the cover plate is fitted with display panel first, and then assembling of the backlight module and fixation of the printed circuit board are performed, so the printed circuit board remains at the active state in the fitting process of the cover plate and in the assembling process of the backlight module. Thus, in the flexible printed circuit, the first wiring area close to the first bonding area which is bound with the display panel is frequently bent. Since the first wiring area has high strength, the first bonding area receives intermittent stresses, which particularly imposes high requirements on the operation skills of an operator. Improper operations may result in breakage of part of gold fingers in the first bonding area of the flexible printed circuit. According to the embodiments of the present invention, the reinforcing structures are arranged only in the second wiring area 14 and the fourth wiring area 16 of the flexible substrate 10 to improve the impact strength of the flexible printed circuit, while only signal wirings 21 are arranged in the first wiring area 13 close to the first bonding area 11, and no reinforcing structure is arranged in the first wiring area, thereby reducing transmission of the bending stress to the first bonding area 11, lowering a breakage risk for the gold fingers in the first bonding area 11 of the flexible printed circuit, and also lowering requirements for operator's operation skills in the fitting process of the cover plate and in the assembling process of the backlight module. Moreover, only signal wirings 21 are arranged in the first wiring area 12, which may also improve the bending resistance of the flexible printed circuit.

It should be noted that, the first reinforcing structure 31 is distributed in all regions of the second wiring area 14, and the second reinforcing structure 32 is distributed in all regions of the fourth wiring area 16.

Figure 3:
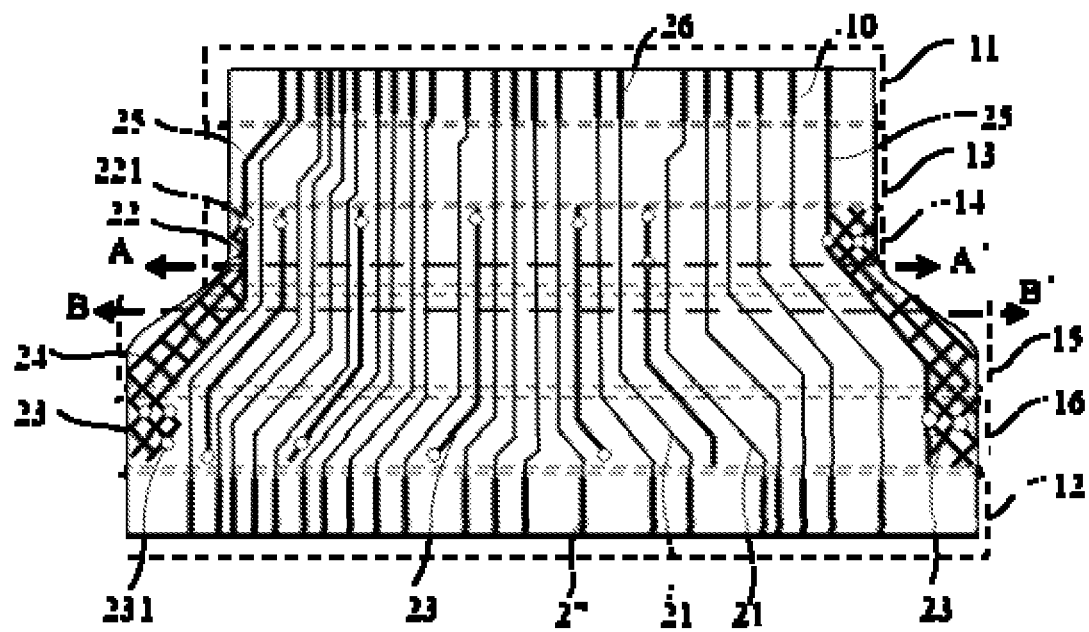
FIG. 3 illustrates a structural diagram of a first surface of another flexible printed circuit according to the embodiments of the present invention.
Figure 4:
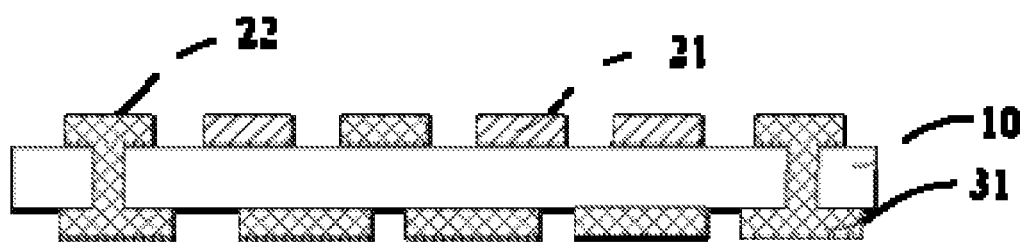
FIG. 4 illustrates a sectional view along a cross section A-A' in the flexible printed circuit shown in FIG. 3.

Further, as shown in FIG. 3 and FIG. 4, the flexible printed circuit further comprises a third reinforcing structure 22 and a fourth reinforcing structure 23 which are arranged on the same layer as the signal wirings 21, wherein the third reinforcing structure 22 is located in the second wiring area 14, the fourth reinforcing structure 23 is located in the fourth wiring area 16, orthographic projections of the third reinforcing structure 22 and the fourth reinforcing structure 23 on the flexible substrate 10 are not superimposed with orthographic projections of the signal wirings 21 on the flexible substrate 10; wherein the third reinforcing structure 22 is connected to the first reinforcing structure 31 through a first via hole 221 that penetrates through the flexible substrate 10, and the fourth reinforcing structure 23 is connected to the second reinforcing structure 32 via a second hole 231 that penetrates through the flexible substrate 10.

To further improve the impact strength of the flexible printed circuit, the third reinforcing structure 22 and the fourth reinforcing structure 23 may also be formed on a side of the flexible substrate 10 away from the reinforcing layer 30, that is, the third reinforcing structure 22 and the fourth reinforcing structure 23 are arranged on the same layer as the signal wirings 21, and, the third reinforcing structure 22 is located in the second wiring area 14 and the fourth reinforcing structure 23 is located in the fourth wiring area 16. Therefore, the strength of the second wiring area 14 may be further increased by the third reinforcing structure 22, and the strength of the fourth wiring area 16 may be further increased by the fourth reinforcing strength 23, thereby further improving the impact strength of the flexible printed circuit.

In an actual product, to avoid influences of the third reinforcing structure 22 and the fourth reinforcing structure 23 on signals transmitted via the signal wirings 21, positions of the third reinforcing structure 22, the fourth reinforcing structure 23 and the signal wirings 21 on the flexible substrate 10 need to be rationally determined, such that orthographic projections of the third reinforcing structure 22 and the fourth reinforcing structure 23 on the flexible substrate 10 are not superimposed with orthographic projections of the signal wirings 21 on the flexible substrate 10, that is, both the third reinforcing structure 22 and the fourth reinforcing structure 23 do not contact the signal wirings 21.

In addition, the third reinforcing structure 22 is connected to the first reinforcing structure 31 through the first via hole 221 which penetrates through the flexible substrate 10, that is, in the second wiring area 14, the third reinforcing structure 22 and the first reinforcing structure 31 located on the two sides of the flexible substrate 10 are connected. The fourth reinforcing structure 23 is connected to the second reinforcing structure 32 also through the second via hole 231 which penetrates through the flexible substrate 10, that is, in the fourth wiring area 16, the fourth reinforcing structure 23 and the second reinforcing structure 32 located on the two sides of the flexible substrate 10 are connected.

Figure 5:
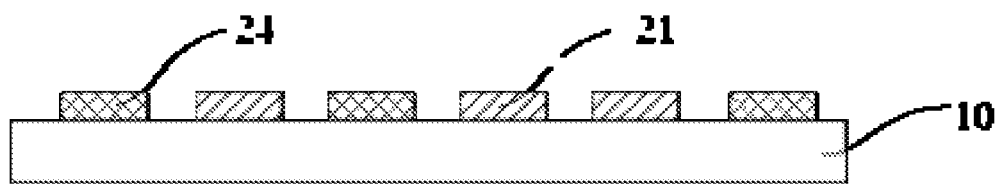
FIG. 5 illustrates a sectional view along a cross section B-B' in the flexible printed circuit shown in FIG. 3.

Further, as shown in FIG. 3 and FIG. 5, the flexible printed circuit further comprises a fifth reinforcing structure 24 arranged on the same layer as the signal wirings 21, wherein the fifth reinforcing structure 24 is located in the third wiring area 15, and an orthographic projection of the fifth reinforcing structure 24 on the flexible substrate 10 is not superimposed with the orthographic projections of the signal wirings 21 on the flexible substrate 10; wherein the fifth reinforcing structure 24 is connected to the second reinforcing structure 22 and the fourth reinforcing structure 23, respectively.

To further improve the impact strength of the third wiring area 15 while ensuring the bending performance of the third wiring area 15 in the flexible printed circuit, the fifth reinforcing structure 24 may also be formed on a side of the flexible substrate 10 away from the reinforcing layer 30, that is, the fifth reinforcing layer 24 and the signal wirings 21 are arranged on the same layer, and the fifth reinforcing layer 24 is located in the third wiring area 15. Therefore, the strength of the third wiring area 15 may be further increased by the fifth reinforcing structure 24, thereby further improving the impact strength of the flexible printed circuit.

In an actual product, to avoid influences of the fifth reinforcing structure 24 on signals transmitted via the signal wirings 21, positions of the fifth reinforcing structure 24 and the signal wirings 21 on the flexible substrate 10 need to be rationally determined, such that the orthographic projection of the fifth reinforcing structure 24 on the flexible substrate 10 is not superimposed with orthographic projections of the signal wirings 21 on the flexible substrate 10, that is, the fifth reinforcing structure 24 does not contact the signal wirings 21.

In addition, the fifth reinforcing structure 24 is respectively connected to the third reinforcing structure 22 and the fourth reinforcing structure 23. Therefore, the third reinforcing structure 22 is connected to the first reinforcing structure 31 through the first via hole 221, the third reinforcing structure 22 is also connected to the fifth reinforcing structure 24, the fifth reinforcing structure 24 is connected to the fourth reinforcing structure 23, and the fourth reinforcing structure 23 is connected to the second reinforcing structure 32 through the second via hole 231.

It should be noted that, the third reinforcing structure 22, the fourth reinforcing structure 23 and the fifth reinforcing structure 24 may be respectively arranged on left and right sides of each of all the signal wirings 21, or the third reinforcing structure 22, the fourth reinforcing structure 23 and the fifth reinforcing structure 24 may be arranged between any two adjacent signal wirings 21.

Further, as shown in FIG. 3, the wiring layer further comprises a ground wiring 25 located in the first wiring area 13, and the ground wiring 25 is connected to the third reinforcing structure 22, wherein materials of the first reinforcing structure 31, the second reinforcing structure 32, the third reinforcing structure 22, the fourth reinforcing structure 23 and the fifth reinforcing structure 24 are all electrically conductive materials.

To meet requirements of the displaying device for Electro-Static discharge (ESD) and Electro Magnetic Compatibility (EMC), the ground wiring 25 also needs to be formed on the side of the flexible substrate 10 away from the reinforcing layer 30, that is, the ground wiring 25 and the signal wirings 21 are arranged on the same layer, and the ground wiring 25 is located in the first wiring area 13. Specifically, the groundline 25 may be arranged respectively on two sides of each of all the signal wirings 21, that is, the ground wiring 25 is arranged on the left side of each of all the signal wirings 21, and the ground wiring 25 is also arranged on the right side of each of all the signal wirings 21.

In an actual product, electrically conductive materials may be used to manufacture the first reinforcing structure 31, the second reinforcing structure 32, the third reinforcing structure 22, the fourth reinforcing structure 23 and the fifth reinforcing structure 24; and, the ground wiring 25 are connected to the third reinforcing structure 22, the third reinforcing structure 22 is respectively connected to the first reinforcing structure 31 and the fifth reinforcing structure 24, the fifth reinforcing structure 24 is connected to the fourth reinforcing structure 23, and the fourth reinforcing structure 23 is connected to the second reinforcing structure 32. Therefore, through connection between the ground wirings 25 on the left and right sides and each of the reinforcing structures, a ground loop around all the signal wirings 21 may be formed. The ground loop increases a common-ground effect, and improves ESD and EMC abilities.

Wherein, the conductive materials of the first reinforcing structure 31, the second reinforcing structure 32, the third reinforcing structure 22, the fourth reinforcing structure 23 and the fifth reinforcing structure 24 are metal materials, for example, copper. Moreover, the signal wirings 21, the ground wirings 25, the first reinforcing structure 31, the second reinforcing structure 32, the third reinforcing structure 22, the fourth reinforcing structure 23 and the fifth reinforcing structure 24 are all made of the same material.

According to the embodiments of the present disclosure, the first reinforcing structure 31 and the second reinforcing structure 32 are both of a net-like structure.

Wherein, the first reinforcing structure 31 comprises a plurality of first metal wirings which are parallel to each other and a plurality of second metal wirings which are parallel to each other either, the first metal wirings are crossed with the second metal wirings, for example, the first metal wirings and the second metal wirings are perpendicular to each other. The crossing of the first metal wirings and second metal wirings enable the first reinforcing structure 31 to be distributed in a net-like manner. When the first reinforcing structure 31 is distributed in a net-like manner, the first reinforcing structure 31 increases the strength of the second wiring area 14, and at the same time, may ensure the bending toughness of the flexible printed circuit in the second wiring area 14 and smooth transition to the flexibility of the flexible printed circuit in the first wiring area 13, so that a large stress is not transmitted to the first bonding area 11 in the fitting process of the cover plate and in the assembling process of the backlight module.

Correspondingly, the second reinforcing structure 32 also comprises a plurality of third metal wirings which are parallel to each other and a plurality of fourth metal wirings which are parallel to each other either, the third metal wirings are crossed with the fourth metal wirings, for example, the third metal wirings and the fourth metal wirings are perpendicular to each other. The crossing of the third metal wirings and fourth metal wirings enable the second reinforcing structure 32 to be also distributed in a net-like manner. When the second reinforcing structure 32 is distributed in a net-like manner, the second reinforcing structure 32 increases the strength of the fourth wiring area 16, and at the same time, may ensure the bending toughness of the flexible printed circuit in the fourth wiring area 16, so that a large stress is not transmitted to the second bonding area 12 in the fitting process of the cover plate and in the assembling process of the backlight module.

The third reinforcing structure 22, the fourth reinforcing structure 23 and the fifth reinforcing structure 24 may also be of a net-like structure.

According to the embodiments of the present disclosure, the flexible printed circuit further comprises a plurality of first gold fingers 26 and a plurality of second gold fingers 27 which are arranged on the same layer as the signal wirings 21, wherein the first gold fingers 26 are located in the first bonding area 11, the second gold fingers 27 are located in the second bonding area 12, and the signal wirings 21 are respectively connected to the first gold fingers 26 and the second gold fingers 27; wherein, a distance between the second reinforcing structure 32 and each of the second gold fingers 27 is greater than or equal to 0.2 mm.

A plurality of first gold fingers 26 are arranged in the first bonding area 11 of the flexible substrate 10, and the first gold fingers 26 and the signal wirings 21 are arranged on the same layer and connected with each other. A plurality of second gold fingers 27 are arranged in the second bonding area 12 of the flexible substrate 10, and the second gold fingers 27 and the signal wirings 21 are arranged on the same layer and connected with each other. After the flexible printed circuit is bound with the display panel and the printed circuit board, the first gold fingers 26 are connected to pins in the display panel, and the second gold fingers 27 are connected with pins in the printed circuit board, thereby realizing circuit connection between the display panel and the printed circuit board through the flexible printed circuit.

Moreover, the distance between the second reinforcing structure 32 and each of the second gold fingers 27 is greater than or equal to 0.2 mm. For example, the distance between the second reinforcing structure 32 and each of the second gold fingers 27 is 0.3 mm, 0.4 mm, etc. Moreover, by setting the distance between the second reinforcing structure 32 and each of the second gold fingers 27 to be greater than or equal to 0.2 mm, the second gold fingers 27 are prevented from breaking by stresses due to a short distance between the second reinforcing structure 32 and each of the second gold fingers 27 in the fitting process of the cover plate and in the assembling process of the backlight module.

It should be noted that, the distance between the second reinforcing structure 32 and each of the second gold fingers 27 refers to a spacing distance between the second reinforcing structure 32 and each of the second gold fingers 27 in a direction toward the second bonding area 12 from the first bonding area 11.

When the fourth reinforcing structure 23 is arranged in the fourth wiring area 16, a distance between the fourth reinforcing structure 23 and each of the second gold fingers 27 is also greater than or equal to 0.2 mm.

In addition, ground gold fingers are also arranged in the first bonding area 11 of the flexible substrate 10. The ground gold fingers are arranged on the same layer as the first gold fingers 26. The ground gold fingers are connected to the ground traces 25 in the first wiring area 13 to conduct a ground function.

According to the embodiments of the present disclosure, the impact strength of the flexible printed circuit is increased by arranging the first reinforcing structure in the second wiring area of the flexible substrate and arranging the second reinforcing structure in the fourth wiring area of the flexible substrate, so when the displaying device receives an impact, the flexible printed circuit may not be torn, thereby ensuring normal use of the displaying device and enhancing the yield and reliability of the displaying device.

Refer to FIG. 6 which illustrates a flowchart of a manufacturing method of a flexible printed circuit according to the embodiments of the present invention. The manufacturing method may specifically comprise the following steps:

Step 601, a flexible substrate is provided, wherein the flexible substrate is divided into wiring areas, and a first bonding area and a second bonding area which are located on two sides of the wiring areas, and the wiring areas comprise a first wiring area, a second wiring area, a third wiring area and a fourth wiring which are away from the first bonding area in sequence.

According to the embodiments of the present disclosure, first, a flexible substrate 10 is provided, and according to the fixing manner and fixing position of a displaying device, the flexible substrate is divided into wiring areas, and the first bonding area 11 and the second bonding area 12 which are located on two sides of the wiring areas, and the wiring areas include the first wiring area 13, the second wiring area 14, the third wiring area 15 and the fourth wiring 16 which are away from the first bonding area 11 in sequence.

Step 602, a wiring layer is formed on the flexible substrate, wherein the wiring layer comprises a plurality of signal wirings arranged along the first wiring area, the second wiring area, the third wiring area and the fourth wiring area.

According to the embodiments of the present disclosure, a plurality of signal wirings 21 are formed on a side of the flexible substrate 10 by a patterning process after the flexible substrate 10 is obtained, and the signal wirings 21 are distributed along the first wiring area 13, the second wiring area 14, the third wiring area 15 and the fourth wiring area 16, that is, each of the signal wirings 21 extends from the first wiring 13 to the fourth wiring area 16.

When the flexible substrate 10 is also provided with a third reinforcing structure 22, a fourth reinforcing structure 23, a fifth reinforcing structure 24 and ground wirings 25, and the third reinforcing structure 22, the fourth reinforcing structure 23, the fifth reinforcing structure 24, the ground wirings 25 and the signal wirings 21 are made of the same material, the third reinforcing structure 22, the fourth reinforcing structure 23, the fifth reinforcing structure 24, the ground wirings 25 and the signal wirings 21 are formed using a same patterning process at the same time.

Specifically, a metal film layer is deposited on the flexible substrate 10; the metal film layer is coated with photoresist; a mask plate is used to expose the photoresist; after exposure is completed, the photoresist is developed to remove the photoresist in a partial area; the metal film layer in the area with the photoresist removed is etched; and finally, the photoresist is peeled off to obtain the signal wirings 21, the third reinforcing structure 22, the fourth reinforcing structure 23, the fifth reinforcing structure 24 and the ground wirings 25.

Step 603, a reinforcing layer is formed on a side of the flexible substrate away from the wiring layer, wherein the reinforcing layer comprises the first reinforcing structure located in the second wiring area and the second reinforcing structure located in the fourth wiring area.

According to the embodiments of the present invention, the reinforcing layer 30 is formed on the side of the flexible substrate 10 away from the wiring layer after the flexible substrate 10 is obtained, wherein the reinforcing layer 30 comprises the first reinforcing structure 31 located in the second wiring area 14 and the second reinforcing structure 32 located in the fourth wiring area 16.

Wherein, the first reinforcing structure 31 and the second reinforcing structure 32 are both made of a metal material, and may also be formed on the side of the flexible substrate 10 away from the wiring layer using a patterning process.

It should be noted that, the sequence of step 602 and step 603 is not fixed. The signal wirings 21 may be formed on the flexible substrate 10 first, and then the first reinforcing structure 31 and the second reinforcing structure 32 are formed; or the first reinforcing structure 31 and the second reinforcing structure 32 are formed first, and followed by the signal wirings 21. This sequence is not limited in the embodiments of the present invention.

According to the embodiments of the present disclosure, the impact strength of the flexible printed circuit is increased by arranging the first reinforcing structure in the second wiring area of the flexible substrate and arranging the second reinforcing structure in the fourth wiring area of the flexible substrate, so when the displaying device receives an impact, the flexible printed circuit may not be torn, thereby ensuring normal use of the displaying device and enhancing the yield and reliability of the displaying device.

The embodiments of the present disclosure provides a displaying device, as shown in FIG. 7, comprising a display panel 71, a printed circuit board 72 and the aforementioned flexible printed circuit 73, wherein the flexible printed circuit 73 is respectively bound with the display panel 71 and the printed circuit board 72.

Wherein, the display panel 71 is bound with first gold fingers 26 in a first bonding area 11 in the flexible printed circuit 73, and the printed circuit board 72 is bound with second gold fingers 27 in a second bonding area 12 in the flexible printed circuit 73.

The specific description of the flexible printed circuit 73 may be understood with reference to Embodiment 1 and Embodiment 2, and is not repeated here.

In addition, the displaying device further comprises a cover plate and a backlight module, wherein the cover plate covers a light-outgoing surface of the displaying panel 71, and the backlight module is located on a side of the backlight panel 71 away from the cover plate; wherein, as shown in FIG. 8, the backlight module comprises an adhesive frame 80, the adhesive frame 80 is provided with a bonding structure 81 and a buffer structure 82 arranged on the same layer on an adhesive frame surface opposite to the cover plate, the bonding structure 81 is respectively bonded with the adhesive frame 80 and the cover plate, and the buffer structure 82 is positioned at a corner of the adhesive frame surface.

In an actual product, the cover plate is arranged on the light-outgoing surface of the display panel. The display panel and other structures are protected by the cover plate. The backlight module is arranged on a side opposite to the light-outgoing surface of the display panel. The backlight module comprises an optical film material, a backplane, an adhesive frame, etc.

In an actual assembling process, the display panel 71 and the printed circuit board 72 are bound through the flexible printed circuit 73 first; then, the bound display panel is fitted with the cover plate using Optical Clear Resin (OCR) to obtain a display module; and finally, the display module and the backlight module are fixed together.

In related art, a ring of double-faced tape is pasted on the adhesive frame surface opposite to the cover plate. The double-faced tape implements fixation of the display module and the backlight module. However, since the adhesive frame surface and a cover plate surface are not absolute flat surfaces and have certain deformations. When the adhesive frame surface and the cover plate surface are fixed through the double-faced tape, a local stress is not uniform, resulting in a local stress on the cover plate. The stress on the cover plate is transmitted to the display panel through the OCR. Then, a liquid crystal cell deforms when the display panel is influenced by an external force, so that the cell gap of the liquid crystal cell and the array of liquid crystal molecules may change, resulting in those light rays which are originally blocked exit via the light-outgoing surface of the display panel. Therefore, a serious light-leaking problem is generated. Usually, corners of the display panel are more sensitive to stresses, so light usually leaks via the corners of the display panel.

To overcome the light-leaking problem of the display panel, according to the embodiments of the present disclosure, the bonding structure 81 and the buffer structure 82 are arranged on the adhesive frame surface opposite to the cover plate. The bonding structure 81 and the buffer structure 82 are arranged on the same layer. The bonding structure 81 implements fixation of the display module and the backlight module, and the buffer structure 82 is located at each of the corners of the adhesive frame surface, that is, at the four corners of the adhesive frame surface, the original double-faced tape is replaced by the buffer structure 82. The buffer structure 82 is used to absorb partial deformations of the adhesive frame surface and the cover plate surface to improve the stress at the corners of the cover plate. Correspondingly, an external force transmitted by the cover plate to the display panel via the OCR is also reduced to alleviate or avoid deformations of the liquid crystal cell, thereby solving the light-leaking problem of the display panel.

Specifically, the adhesive frame surface comprises a first surface, a second surface, a third surface and a fourth surface which are connected end to end in sequence, wherein the first surface is parallel to the third surface, the second surface is parallel to the fourth surface, and the first surface and the second surface are perpendicular to each other. Four corners of the adhesive frame surface respectively refer to: a position where the first surface is close to the second surface and the second surface is close to the first surface, a position where the second surface is close to the third surface and the third surface is close to the second surface, a position where the third surface is close to the fourth surface and the fourth surface is close to the third surface, and a position where the fourth surface is close to the first surface and the first surface is close to the fourth surface.

Wherein, the bonding structure 81 is a double-faced tape, and the buffer structure 82 is foam.

Further, the buffer structure 82 has a concave portion on a surface toward the bonding structure 81, the bonding structure 81 has a convex portion on a surface toward the buffer structure 82, and the convex portion is embedded in the concave portion.

That is, a surface of the buffer structure 82 toward the bonding structure 81 and a surface of the bonding structure 81 toward the buffer structure 82 are not flat surfaces; the surface of the buffer structure 82 toward the bonding structure 81 is step-like to form the concave portion, the surface the bonding structure 81 toward the buffer structure 82 is also step-like to form the convex portion, and the concave portion and the convex portion are matched with each other; moreover, when the buffer structure 82 and the bonding structure 81 are arranged on the adhesive frame surface, the convex portion is embedded in the concave portion.

If the surface of the buffer structure 82 toward the bonding structure 81 and the surface of the bonding structure 81 toward the buffer structure 82 are set to be flat surfaces, no clearance exists between the buffer structure 82 and the bonding structure 81 when the buffer structure 82 and the bonding structure 81 are arranged on the adhesive frame surface, so that impurities such as dust enter the displaying device via the clearance. Therefore, according to the embodiments of the present invention, by setting the surface of the buffer structure 82 toward the bonding structure 81 as the concave portion, setting the bonding structure 81 toward the buffer structure 82 as the convex portion, and embedding the convex portion in the concave portion, the buffer structure 82 and the bonding structure 81 contact each other in a tighter manner, thereby lowering a risk of dust seepage and improving the dust-proof effect of the displaying device.

As shown in FIG. 8, the buffer structure 82 has a length L1 of 15 mm to 30 mm in a direction of the buffer structure 82 toward the bonding structure 81 which contacts the buffer structure 82. For Example, the length L1 of the buffer structure 82 is 18 mm, 20 mm, 25 mm, etc. Moreover, the length of each of the buffer structures 82 contacting with the bonding structure 81 may be identical or different.

By reasonably setting the length L1 of each of the buffer structures 82, the bonding structure 81 may firmly fix the display module and the backlight module, and at the same time, the buffer structure 82 absorbs more partial deformations of the adhesive frame surface and the cover plate surface, thereby better solving the light-leaking problem of the display panel.

In addition, after the backlight module and the display panel are fixed, part of areas of the flexible printed circuit 73 are exposed outside, for example, the third trace area 15 in the flexible printed circuit 73 is exposed. Therefore, a tape layer should be arranged on the exposed flexible printed circuit 73 to protect the exposed flexible printed circuit 73.

According to the embodiments of the present disclosure, the impact strength of the flexible printed circuit is increased by arranging the first reinforcing structure in the second trace area of the flexible substrate and arranging the second reinforcing structure in the fourth trace area of the flexible substrate, so when the displaying device receives an impact, the flexible printed circuit may not be torn, thereby ensuring normal use of the displaying device and enhancing the yield and reliability of the displaying device.

The aforementioned method embodiments are simply described as combinations of a series of actions, but those skilled in the art shall know that the present disclosure is not limited by the described action sequence, because some steps may be implemented in other sequence or simultaneously according to the present invention. Moreover, those skilled in the art shall also know that the embodiments described in this specification are preferred ones, and actions and modules therein are not necessary for the present invention.

The embodiments in this specification are described progressively, and differ in respective highlights. Similar or identical contents of the embodiments can be used for mutual reference.

Finally, it should be noted that relational terms in this specification such as "first" and "second" are merely used to distinguish one entity or operation from the other one, and do not definitely indicate or imply any actual relation or sequence between these entities or operations. In addition, the terms "comprise" and "include" and any other variations are intended to refer to non-exclusive inclusion, so a process, method, article or device comprising a series of elements not only comprise those elements listed, but also include other elements that are not explicitly listed or inherent elements of the process, method, article or device. In the absence of more restrictions, a process, method, article or device comprising an element defined by "one" shall not exclusive of other identical elements.

The above describes in detail the flexible printed circuit and manufacturing method thereof and the displaying device according to the embodiments of the application. In this specification, the principle and implementation of the present disclosure are expounded by means of specific embodiments, which are described merely for assisting those skilled in the art in understanding the method and core concept of the present invention. Moreover, those ordinarily skilled in the art can make variations to the specific embodiments and application scope based on the idea of the present invention. So, the contents in this specification should not be construed as limiting the present invention.

The invention claimed is:

1. A flexible printed circuit, comprising a flexible substrate, wherein the flexible substrate is divided into wiring areas, a first bonding area and a second bonding area which are located on two sides of the wiring areas, and the wiring areas comprise a first wiring area, a second wiring area, a third wiring area and a fourth wiring which are away from the first bonding area in sequence;
   the flexible printed circuit further comprises a wiring layer arranged on the flexible substrate and a reinforcing layer arranged on a side of the flexible substrate away from the wiring layer;
   the wiring layer comprises a plurality of signal wirings arranged along the first wiring area, the second wiring area, the third wiring area and the fourth wiring area, and the reinforcing layer comprises a first reinforcing structure located in the second wiring area and a second reinforcing structure located in the fourth wiring area;
   the flexible printed circuit further comprises a third reinforcing structure and a fourth reinforcing structure which are arranged on a same layer as the signal wirings, the third reinforcing structure is located in the second wiring area, the fourth reinforcing structure is located in the fourth wiring area, and orthographic projections of the third reinforcing structure and the fourth reinforcing structure on the flexible substrate are not superimposed with orthographic projections of the signal wirings on the flexible substrate;
   the third reinforcing structure is connected to the first reinforcing structure through a first via hole that penetrates through the flexible substrate, and the fourth reinforcing structure is connected to the second reinforcing structure through a second via hole that penetrates through the flexible substrate;
   the flexible printed circuit further comprises a fifth reinforcing structure arranged on a same layer as the signal wirings, wherein the fifth reinforcing structure is located in the third wiring area, and an orthographic projection of the fifth reinforcing structure on the flexible substrate is not superimposed with orthographic projections of the signal wirings on the flexible substrate; and
   the fifth reinforcing structure is respectively connected to the third reinforcing structure and the fourth reinforcing structure.

2. The flexible printed circuit according to claim 1, wherein the wiring layer further comprises a ground wiring located in the first wiring area, and the ground wiring is connected to the third reinforcing structure; and
   materials of the first, second, third, fourth and fifth reinforcing structures are electrically conductive materials.

3. The flexible printed circuit according to claim 1, wherein the first reinforcing structure and the second reinforcing structure are both of a net-like structure.

4. The flexible printed circuit according to claim 1, further comprising a plurality of first gold fingers and a plurality of second gold fingers which are arranged on a same layer as the signal wirings, wherein the first gold fingers are located in the first bonding area, the second gold fingers are located in the second bonding area, and the signal wirings are respectively connected to the first gold fingers and the second gold fingers; and
   a distance between the second reinforcing structure and each of the second gold fingers is greater than or equal to 0.2 mm.

5. The flexible printed circuit according to claim 1, wherein the first bonding area is an area where the flexible printed circuit and a display panel are bound, and the second bonding area is an area where the flexible printed circuit and a printed circuit board are bound.

6. A manufacturing method of a flexible circuit board, comprising:
   providing a flexible substrate, wherein the flexible substrate is divided into wiring areas, a first bonding area and a second bonding area which are located on two sides of the wiring areas, and the wiring areas comprise a first wiring area, a second wiring area, a third wiring area and a fourth wiring which are away from the first bonding area in sequence;
   forming a wiring layer on the flexible substrate, wherein the wiring layer comprises a plurality of signal wirings arranged along the first wiring area, the second wiring area, the third wiring area and the fourth wiring area;

forming a reinforcing layer on a side of the flexible substrate away from the wiring layer, wherein the reinforcing layer comprises a first reinforcing structure located in the second wiring area and a second reinforcing structure located in the fourth wiring area;

forming a third reinforcing structure and a fourth reinforcing structure which are arranged on a same layer as the signal wirings, wherein the third reinforcing structure is located in the second wiring area, the fourth reinforcing structure is located in the fourth wiring area, orthographic projections of the third reinforcing structure and the fourth reinforcing structure on the flexible substrate are not superimposed with orthographic projections of the signal wirings on the flexible substrate, the third reinforcing structure is connected to the first reinforcing structure through a first via hole that penetrates through the flexible substrate, and the fourth reinforcing structure is connected to the second reinforcing structure through a second via hole that penetrates through the flexible substrate; and forming a fifth reinforcing structure arranged on a same layer as the signal wirings, wherein the fifth reinforcing structure is located in the third wiring area, an orthographic projection of the fifth reinforcing structure on the flexible substrate is not superimposed with orthographic projections of the signal wirings on the flexible substrate, and the fifth reinforcing structure is respectively connected to the third reinforcing structure and the fourth reinforcing structure.

7. A displaying device, comprising a display panel, a printed circuit board and the flexible printed circuit according to claim 1, wherein the flexible printed circuit is respectively bound with the display panel and the printed circuit board.

8. The displaying device according to claim 7, wherein a tape layer is arranged on the exposed part of the flexible circuit board.

9. The displaying device according to claim 7, wherein the displaying device further comprising a cover plate and a backlight module, the cover plate covers a light-outgoing surface of the display panel, and the backlight module is located on a side of the display panel away from the cover plate; and the backlight module comprises an adhesive frame, the adhesive frame is provided with a bonding structure and a buffer structure which are arranged on a same layer on an adhesive frame surface opposite to the cover plate, the bonding structure is respectively bonded with the adhesive frame and the cover plate, and the buffer structure is located at a corner of the adhesive frame surface.

10. The displaying device according to claim 9, wherein the buffer structure has a concave portion on a surface toward the bonding structure, the bonding structure has a convex portion on a surface toward the buffer structure, and the convex portion is embedded in the concave portion.

11. The displaying device according to claim 9, wherein the buffer structure has a length of 15 mm to 30 mm in a direction of the buffer structure toward the bonding structure which contacts the buffer structure.

12. The displaying device according to claim 7, wherein the flexible printed circuit further comprises a plurality of first gold fingers and a plurality of second gold fingers which are arranged on a same layer as the signal wirings, the first gold fingers are located in the first bonding area, the second gold fingers are located in the second bonding area, and the signal wirings are respectively connected to the first gold fingers and the second gold fingers; and a distance between the second reinforcing structure and each of the second gold fingers is greater than or equal to 0.2 mm.

13. The displaying device according to claim 7, wherein the first bonding area is an area where the flexible printed circuit and a display panel are bound, and the second bonding area is an area where the flexible printed circuit and a printed circuit board are bound.

14. The displaying device according to claim 12, wherein the wiring layer further comprises a ground wiring located in the first wiring area, and the ground wiring is connected to the third reinforcing structure; and materials of the first, second, third, fourth and fifth reinforcing structures are electrically conductive materials.

* * * * *